US005633600A

United States Patent [19]
Ohnishi

[11] Patent Number: 5,633,600
[45] Date of Patent: May 27, 1997

[54] OUTPUT BUFFER CIRCUIT HAVING A MINIMIZED OUTPUT VOLTAGE PROPAGATION

[75] Inventor: Yasuhiro Ohnishi, Tokyo, Japan

[73] Assignee: NEC Corporation, Tokyo, Japan

[21] Appl. No.: 536,780

[22] Filed: Sep. 29, 1995

[30] Foreign Application Priority Data

Sep. 29, 1994 [JP] Japan .................................. 6-235151

[51] Int. Cl.$^6$ ................................................. H03K 19/017
[52] U.S. Cl. ..................................... 326/17; 326/27; 326/83
[58] Field of Search ............................... 326/29, 27, 26, 326/82, 83, 88, 17; 327/380, 381

[56] References Cited

U.S. PATENT DOCUMENTS

| 4,567,378 | 1/1986 | Raver | 326/27 |
| 5,017,807 | 5/1991 | Kriz et al. | 326/83 |
| 5,204,558 | 4/1993 | Kumaki et al. | 326/87 |
| 5,334,889 | 8/1994 | Hisaka | 326/83 |
| 5,471,150 | 11/1995 | Jung et al. | 326/27 |

FOREIGN PATENT DOCUMENTS 1-194712   8/1989   Japan ................................. 326/17

*Primary Examiner*—Edward P. Westin
*Assistant Examiner*—Benjamin D. Driscoll
*Attorney, Agent, or Firm*—Foley & Lardner

[57] ABSTRACT

In an output buffer circuit so configured that a capacitor connected to a gate of an output driving MOS transistor and including a gate capacitance of the output driving MOS transistor is gradually charged through a resistor, so as to realize a slow rising or falling time, there is additionally provided a threshold voltage charging circuit for rapidly charging the capacitor to a threshold voltage level of the output driving MOS transistor when the output driving MOS transistor is to be turned on. With this arrangement, the propagation delay time of an output voltage can be minimized.

4 Claims, 5 Drawing Sheets

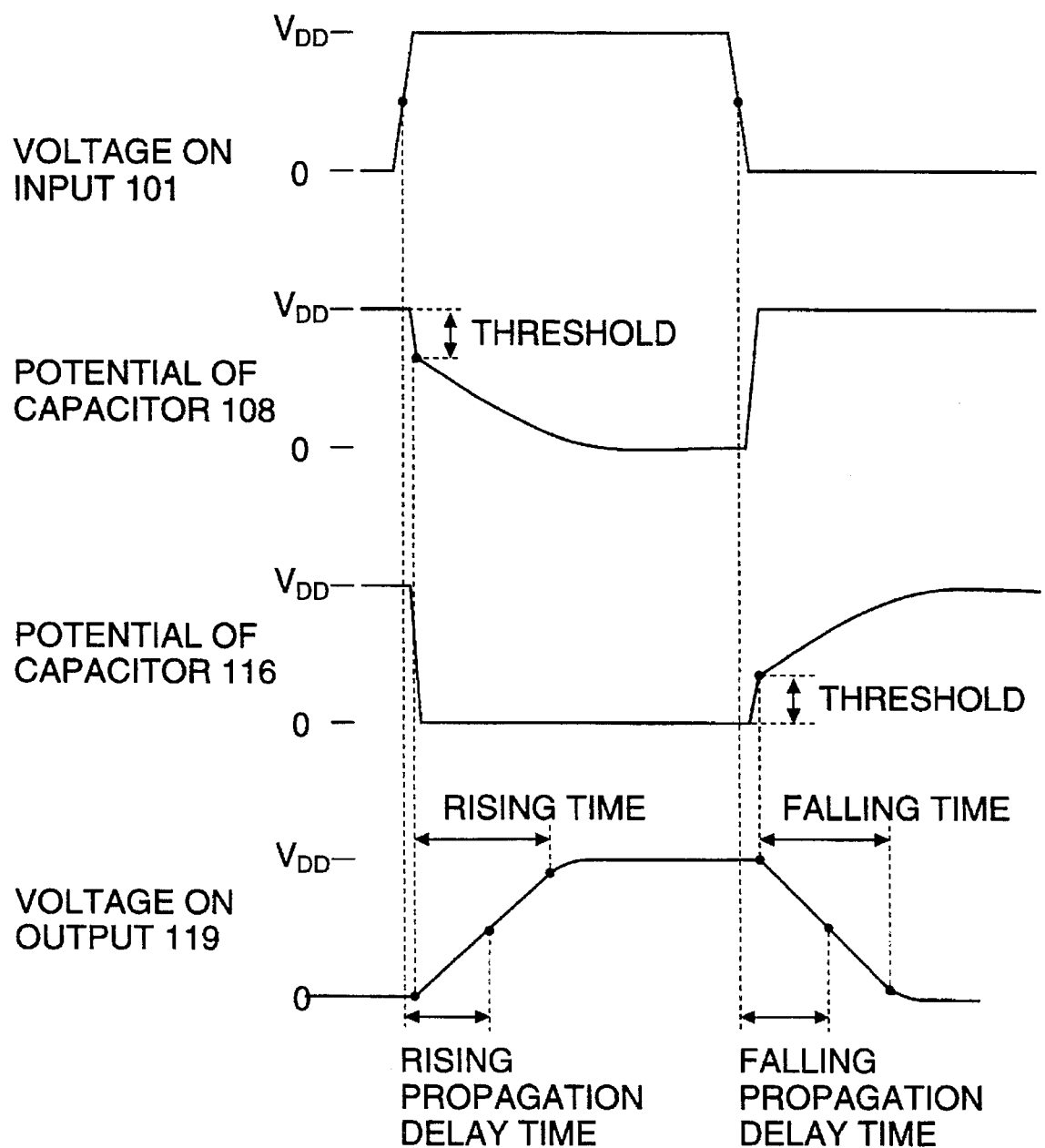

OUTPUT BUFFER CIRCUIT HAVING A MINIMIZED OUTPUT VOLTAGE PROPAGATION

BACKGROUND OF THE INVENTION

1. Field of the Invention

The present invention relates to an output buffer circuit, and more specifically to an output buffer circuit composed of MOS transistors (metal-oxide-semiconductor field effect transistors) and for use in an integrated circuit.

2. Description of Related Art

Recently, integrated circuits is increasing its field of application, and at present have been actually utilized for the control purpose in various fields including an office instrument, an in-house electric instrument, an automobile, etc. As one of various functions of the control-purpose integrated circuits used in the various fields, it is required to internally contain a so called slew rate output buffer.

The slew rate output buffer in a MOSIC (MOS transistor integrated circuit) is a buffer in which an output waveform changes at a low speed when an buffer output changes front a high level to a low level or vice versa, in order to avoid all of MOS transistors driving an output terminal, from being put into an ON condition simultaneously. This output buffer function is effective in preventing generation of noises on a voltage supply line or a ground line in the MOSIC, and also in preventing an overshooting or an undershooting from occurring in the output voltage waveform of the output buffer.

Referring to FIG. 1, there is shown a circuit diagram illustrating one example of a conventional slew rate output buffer circuit in a CMOS (complementary MOS transistor) technology. The shown buffer circuit basically includes an output driving stage composed of a P-channel transistor 310 and an N-channel transistor 311 having their drain electrode connected in common to an output terminal 312. The P-channel transistor 310 has a source electrode connected to a voltage supply line VDD and a gate electrode connected to one end of a capacitor 308, the other end of which is connected to the voltage supply line VDD. The N-channel transistor 311 has a source electrode connected to a ground line and a gate electrode connected to one end of a capacitor 309, the other end of which is connected to the ground line. Here, each of the capacitors 308 and 309 includes a capacitance of the gate electrode of the MOS transistor connected with the capacitor concerned.

An input terminal 301 is connected to an input of each of inverters 302 and 303, which cooperate with the input terminal to control a charging/discharging timing of the capacitors 308 and 309. For this purpose, an output of the inverter 302 is connected through a resistor 304 to the one end of the capacitor 308 so as to charge the capacitor 308 to a ground level. A P-channel transistor 306 having its gate connected to the input terminal 301, its source connected to the voltage supply line VDD and its drain connected to the one end of the capacitor 308, acts to discharge the capacitor 308 to a voltage supply level. An output of the inverter 303 is connected through a resistor 305 to the one end of the capacitor 309 so as to charge the capacitor 309 to the voltage supply level. An N-channel transistor 307 having its gate connected to the input terminal 301, its source connected to the ground line and its drain connected to the one end of the capacitor 309, acts to discharge the capacitor 309 to ground level.

Now, operation of the circuit shown in FIG. 1 will be described with reference to FIG. 2, which illustrates waveforms on various points in the circuit shown in FIG. 1.

When an input voltage applied to the input terminal 301 is a low level, the P-channel transistor 306 is on, so that the capacitor 308 is in a condition discharged to the voltage supply level. On the other hand, the N-channel transistor 307 is off, so that the capacitor 309 is in a condition charged to the voltage supply level through the resistor 305 from the output of the inverter 303. Therefore, the output driving P-channel transistor 310 is off and the output driving N-channel transistor 311 is on, so that an voltage on the output terminal 312 is at a ground level.

When the input voltage of the input terminal 301 rises up from the low level to a high level, the output of the inverter 303 changes to the ground level, and simultaneously, the N-channel transistor 307 is brought from the off condition to the on condition, so that the capacitor 309 is discharged to the ground level, and therefore, the output driving N-channel transistor 311 is immediately turned off.

On the other hand, the P-channel transistor 306 is brought from the on condition to the off condition, and simultaneously, the output of the inverter 302 changes to the ground level. Here, since the capacitor 308 is charged by the output of the inverter 302 through the resistor 304 towards the ground level, the potential on the one end of the capacitor 308 gradually shifts to the ground level. Therefore, the output voltage on the output terminal 312 slowly rises up with a substantial rising time.

Similarly, when the input voltage of the input terminal 301 falls down from the high level to the low level, the capacitor 308 is discharged to the voltage supply level, so that the output driving P-channel transistor 310 is immediately turned off. But, the capacitor 309 is charged through the resistor 305, the potential of the capacitor 309 gradually shifts towards the voltage supply level. Accordingly, the output voltage on the output terminal 312 slowly falls down with a substantial rising time.

Referring to FIG. 3, there is shown a circuit diagram of another conventional output buffer circuit shown in FIG. 2 of Japanese Patent Application Laid-open Publication No. JP-A-2-122725.

The output buffer circuit shown in FIG. 3 is configured to be capable of selecting the rising time and the failing time between a high speed value and a low speed value by means of a control terminal 502 in accordance with an application thereof.

When a signal applied to the control terminal 502 is at a low level, both of an N-channel transistor 507 and a P-channel transistor 508 are off, so that when an output driving MOS transistor is turned on, inverters 503 and 505 having a small driving power will drive a gate of an output driving P-channel transistor 510 and an output driving N-channel transistor 511 with the small drive power, so as to turn on the output driving transistor with a slow driving speed. Therefore, an output voltage of an output terminal 512 has a slow rising time and a slow falling time.

When the signal applied to the control terminal 502 is at a high level, both of the N-channel transistor 507 and the P-channel transistor 508 are on. An N-channel transistor 506 and a P-channel transistor 509 cooperate with the inverters 503 and 505, respectively, to drive the gate of the output driving P-channel transistor 510 and the output driving N-channel transistor 511 with a large drive power, so as to turn on the output driving transistor with a high driving speed. Therefore, the output voltage of the output terminal 512 has a high rising time and a high falling time.

The above mentioned conventional output buffer circuits are so designed that, in order to make slow the rising and the falling of the output voltage on the output terminal, the capacitor means including a gate capacitance of the output driving MOS transistor is gradually charged through a resistor means, so as to turn on the output driving MOS transistor at a low speed.

Because of this reason, the time after the input voltage of the input terminal changes until the potential of the capacitor means is charged to a threshold voltage of the output driving MOS transistor, becomes long, as shown in FIG. 2, and therefore, the rising/falling propagation delay time of the output voltage becomes correspondingly long, as also shown in FIG. 2. In addition, a variation in phase of output signals become large dependently upon a manufacturing condition and a operation condition, so that it is not possible to elevate an operating frequency of the overall system.

SUMMARY OF THE INVENTION

Accordingly, it is an object of the present invention to provide an output buffer circuit which has overcome the above mentioned defect of the conventional one.

Another object of the present invention is to provide an output buffer circuit having an output voltage having a slow rising/falling time but capable of minimizing the output voltage propagation delay time.

The above and other objects of the present invention are achieved in accordance with the present invention by an output buffer circuit comprising an input terminal, an output terminal, an output driving MOS transistor having a drain electrode and a source electrode, one of which is connected to the output terminal, the output driving MOS transistor having a gate electrode for controlling an on/off of the output driving MOS transistor, a capacitor means connected to the gate of the output driving MOS transistor, a resistor means for charging the capacitor means when a potential on the input terminal is at a first signal level of turning on the output driving MOS transistor, a discharging switch means for discharging me capacitor means when the potential on the input terminal is at a second signal level of turning off the output driving MOS transistor, and a threshold voltage charging means for rapidly charging the capacitor means to a threshold voltage level of the output driving MOS transistor when the potential on the input terminal is at the first signal level of turning on the output driving MOS transistor.

The above and other objects, features and advantages of the present invention will be apparent from the following description of preferred embodiments of the invention with reference to the accompanying drawings.

BRIEF DESCRIPTION OF THE DRAWINGS

FIG. 5 illustrates waveforms on various points in the circuit shown in FIG. 4.

DESCRIPTION OF THE PREFERRED EMBODIMENT

Figure 1:
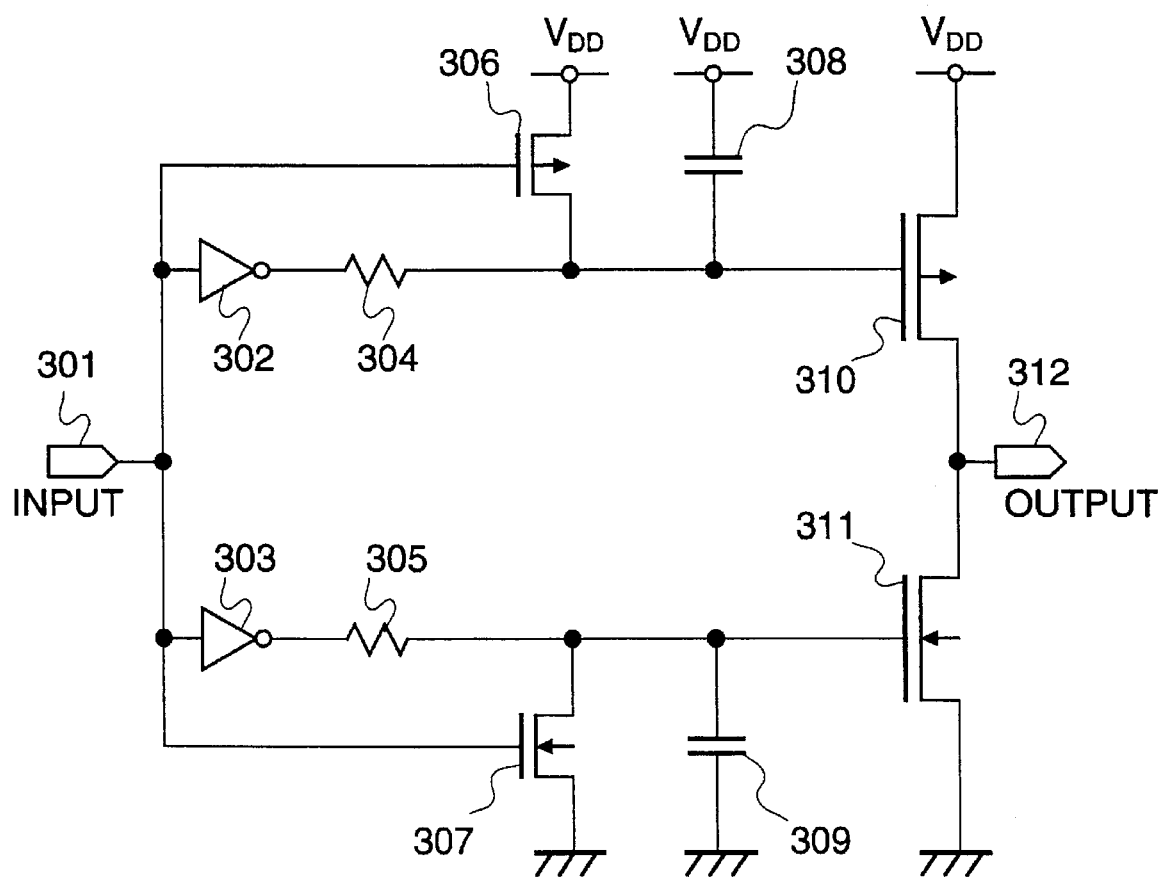
FIG. 1 is a circuit diagram illustrating one example of a conventional slew rate output buffer circuit in a CMOS technology.
Figure 2:
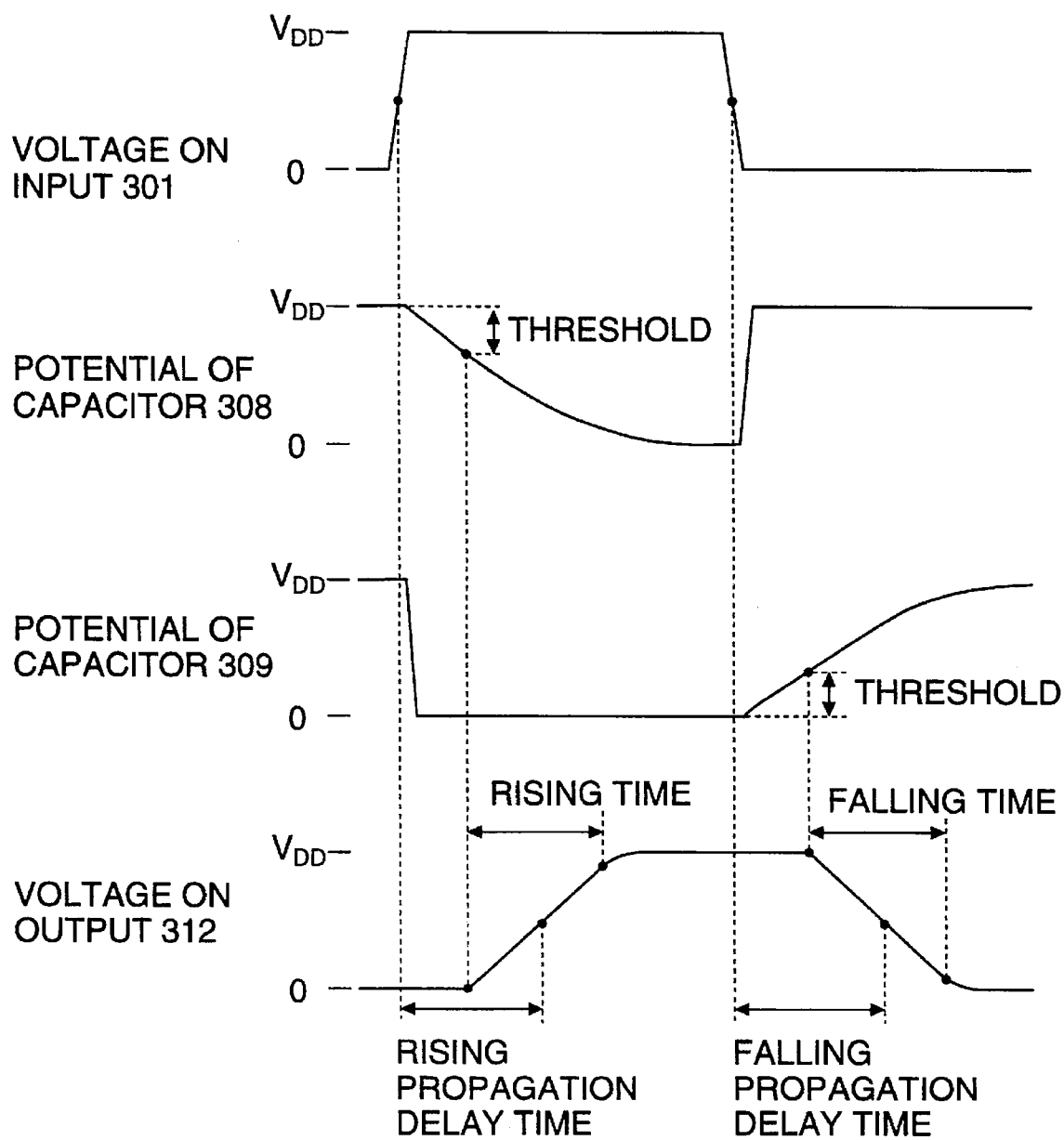
FIG. 2 illustrates waveforms on various points in the circuit shown in FIG. 1.
Figure 3:
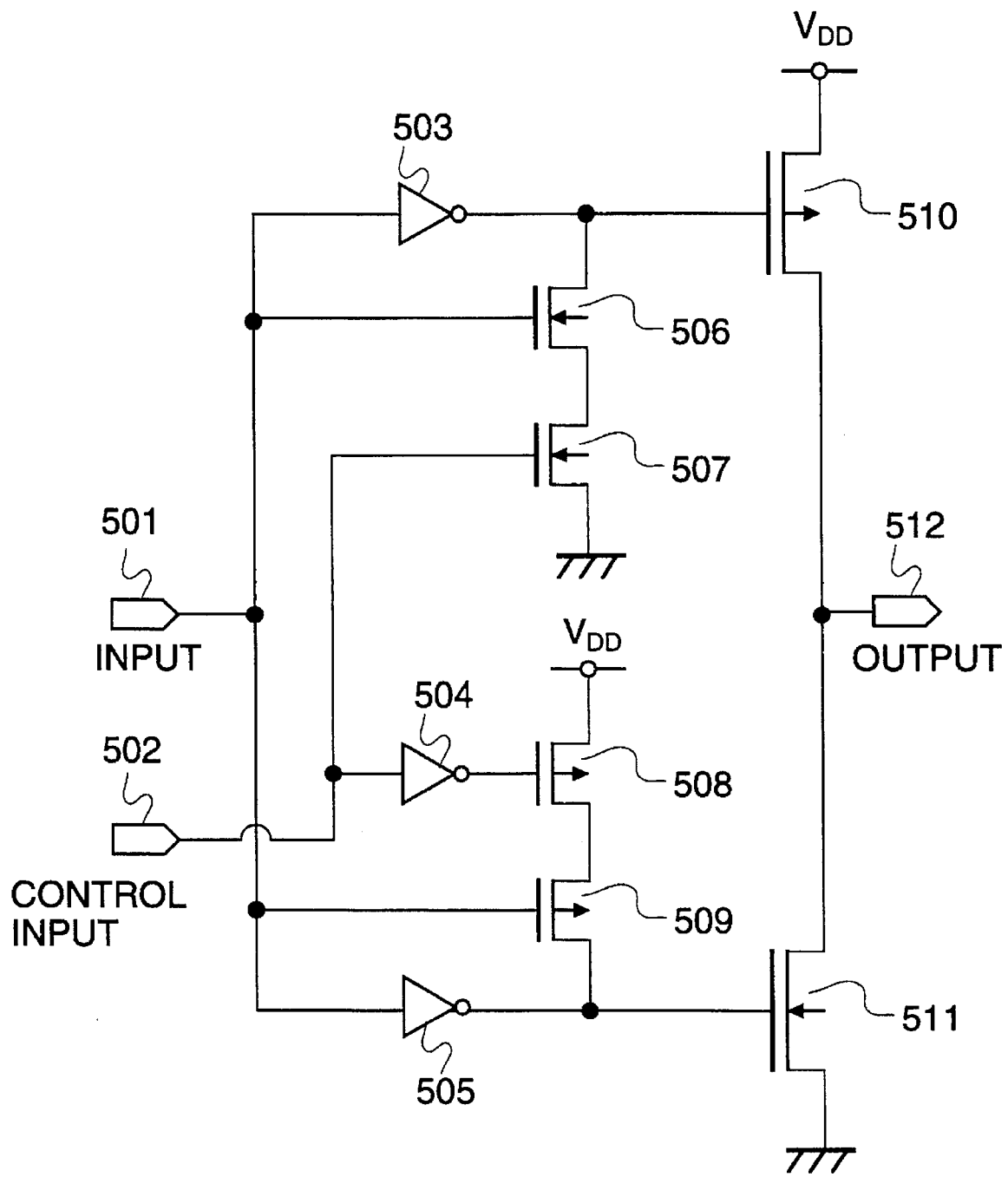
FIG. 3 is a circuit diagram of another conventional output buffer circuit.
Figure 4:
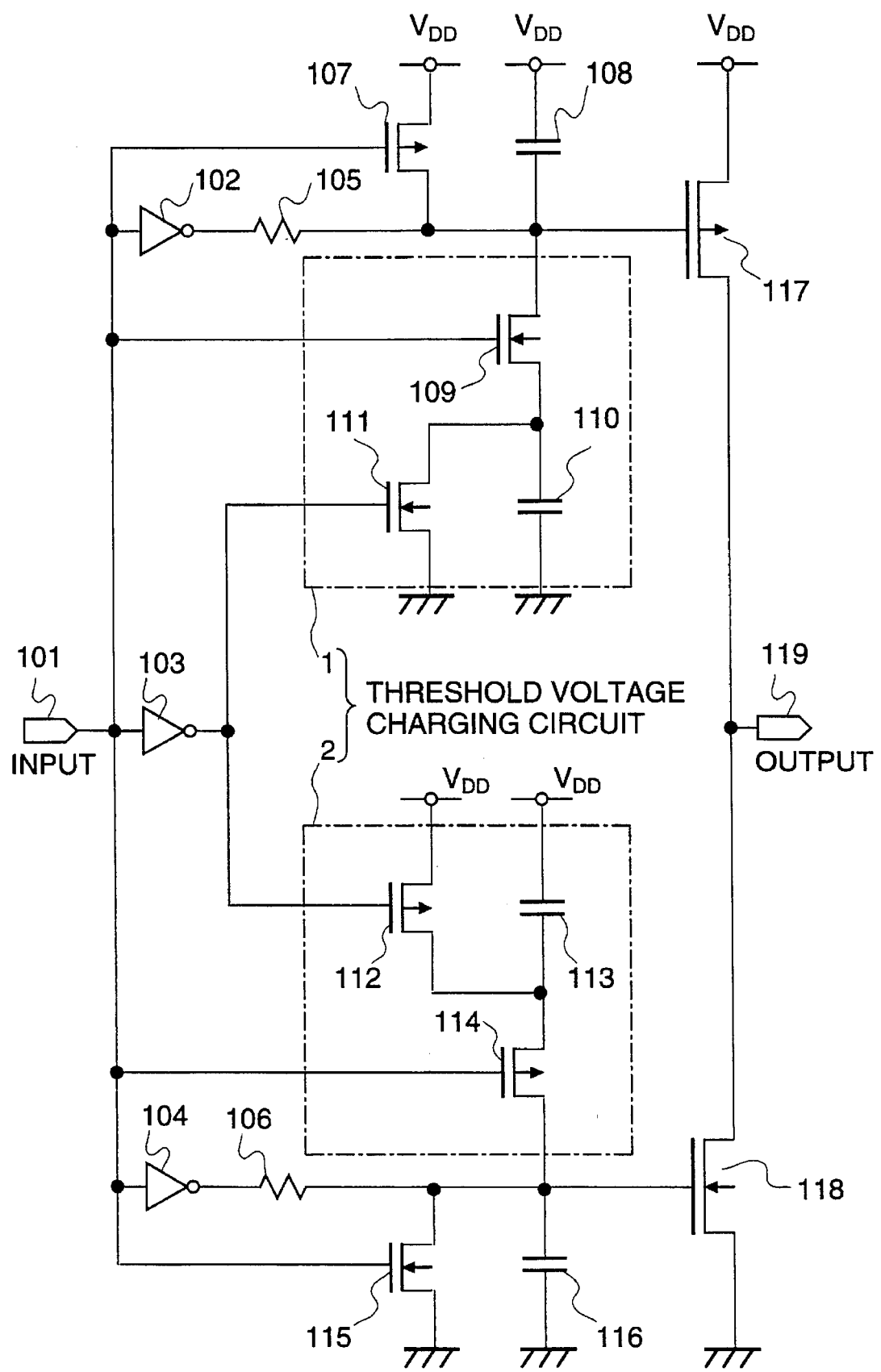
FIG. 4 is a circuit diagram of an embodiment of the output buffer circuit in accordance with the present invention.

Referring to FIG. 4, there is shown a circuit diagram of an embodiment of the output buffer circuit in accordance with the present invention.

The shown output buffer circuit in accordance with the present invention is based on the CMOS technology, and includes an output driving stage composed of a P-channel transistor 117 and an N-channel transistor 118 having their drain electrode connected in common to an output terminal 119. The P-channel transistor 117 has a source electrode connected to a voltage supply line VDD and a gate electrode connected to one end of a capacitor 108, the other end of which is connected to the voltage supply line VDD. The N-channel transistor 118 has a source electrode connected to a ground line and a gate electrode connected to one end of a capacitor 116, the other end of which is connected to the ground line. Here, each of the capacitors 108 and 116 includes a gate capacitance of the gate electrode of the MOS transistor connected with the capacitor concerned and also a wiring capacitance if any.

An input terminal 101 is connected to an input of each of inverters 102, 103 and 104, which cooperate with the input terminal 101 to control a charging/discharging timing of the capacitors 108 and 116. An output of the inverter 102 is connected through a resistor 105 to the one end of the capacitor 108 so as to charge the capacitor 108 to a ground level. A P-channel transistor 107 having its gate connected to the input terminal 101, its source connected to the voltage supply line VDD and its drain connected to the one end of the capacitor 108, acts to discharge the capacitor 108 to a voltage supply level of the voltage supply line VDD. An output of the inverter 104 is connected through a resistor 106 to the one end of the capacitor 116 so as to charge the capacitor 116 to the voltage supply level. An N-channel transistor 115 having its gate connected to the input terminal 101, its source connected to the ground line and its drain connected to the one end of the capacitor 116, acts to discharge the capacitor 116 to the ground level of the ground line.

The shown output buffer further includes a threshold voltage charging circuit I including a capacitor 110 and N-channel transistors 109 and III, and another threshold voltage charging circuit 2 including a capacitor 113 and P-channel transistors 114 and 112.

In brief, the N-channel transistor 109 has its gate connected to the input terminal 101, its source connected to one end of the capacitor 110 having its other end connected to the ground line, and its drain connected to the one end of the capacitor 108. This N-channel transistor 109 acts as a switch for connecting the capacitor 110 to the capacitor 108. The N-channel transistor 111 has its gate connected to an output of the inverter 103, its source connected to the ground line and its drain connected to the one end of the capacitor 110. This N-channel transistor 111 functions to precharge the capacitor 110 to the ground level.

The P-channel transistor 114 has its gate connected to the input terminal 101, its source connected to one end or the capacitor 113 having its other end connected to the voltage supply line VDD, and its drain connected to the one end of the capacitor 116. This P-channel transistor 114 acts as a switch for connecting the capacitor 113 to the capacitor 116. The P-channel transistor 112 has its gate connected to the output of the inverter 103, its source connected to the voltage supply line VDD and its drain connected to the one end of the capacitor 113. This P-channel transistor 112 functions to precharge the capacitor 113 to the voltage supply level.

Now, operation of the circuit shown in FIG. 4 will be described with reference to FIG. 5, which illustrates waveforms on various points in the circuit shown in FIG. 4.

When an input voltage applied to the input terminal 101 is a low level, the P-channel transistor 107 is on, and the N-channel transistor 109 is off, so that the capacitor 108 is in a condition discharged to the voltage supply level. Simultaneously, the N-channel transistor 109 is on, so that the capacitor 110 is in a condition precharged to the ground level. On the other hand, the P-channel transistor 112 and the N-channel transistor 115 are off and the P-channel transistor 114 is on, so that the capacitor 116 and the capacitor 113 are in a condition charged to the voltage supply level through the resistor 106 from the output of the inverter 104.

Therefore, the output driving P-channel transistor 117 is off and the output driving N-channel transistor 118 is on, so that an voltage on the output terminal 119 is at a ground level.

When the input voltage of the input terminal 101 rises up from the low level to a high level, the N-channel transistor 114 is brought from the on condition to the off condition, and the output of the inverter 104 changes to the ground level, and simultaneously, the N-channel transistor 115 is brought from the off condition to the on condition, so that the capacitor 116 is discharged to the ground level, and therefore, the output driving N-channel transistor 118 is immediately turned off.

On the other hand, the P-channel transistor 107 is brought from the on condition to the off condition, and simultaneously, the output of the inverter 102 changes to the ground level so as to charge the capacitor 108 towards t&e ground level through the resistor 105. At the same time, the N-channel transistor 111 is brought from the on condition to the off condition, and simultaneously, the N-channel transistor 109 is brought from the off condition to the on condition, so that the capacitor 110 is connected to the capacitor 108. Thus, electric charges precharged in the capacitor 110 is transferred to the capacitor 108, so that, as shown in FIG. 5, the potential on the capacitor 108 swiftly changes to an intermediate level which is between the voltage supply level and the ground level and which is determined by a ratio in a capacitance between the capacitor 108 and the capacitor 110. Thereafter, since the capacitor 108 and the capacitor 110 are charged through the resistor 105 from the output of the inverter 102, the potential on the one end of the capacitor 108 gradually shifts to the ground level.

Here, by designing the circuit to the effect that the above mentioned intermediate level is equal to a threshold voltage value of the output driving P-channel transistor 117, when the input voltage had risen up, the output driving P-channel transistor 117 is quickly put in a condition just before the turning-on, and thereafter, gradually becomes the on condition. Accordingly, the output voltage of the output terminal 119 takes a voltage waveform having a long rising time (slow rising-up) but a minimized rising propagation delay time.

Similarly, when the input voltage of the input terminal 101 falls down from the high level to the low level, a circuit connected to the gate of the output driving P-channel transistor 117 and a circuit connected to the gate of the output driving N-channel transistor 118 operate in a complementary manner. Namely, the capacitor 108 is discharged to the voltage supply level, so that the output driving P-channel transistor 117 is immediately turned off. On the other hand, the potential of the capacitor 116 is quickly changed to to an intermediate level which is between the voltage supply level and the ground level and which is determined by a ratio in a capacitance between the capacitor 116 and the capacitor 113, as shown in FIG. 5. Thereafter, since the capacitor 116 and the capacitor 113 are charged through the resistor 106, the potential of the capacitor 116 gradually shifts towards the voltage supply level.

Here, by designing the circuit to the effect that the above mentioned intermediate level is equal to a threshold voltage value of the output driving N-channel transistor 118, when the input voltage had fallen down, the output driving N-channel transistor 118 is quickly put in a condition just before the turning-on, and thereafter, gradually becomes the on condition. Accordingly, the output voltage of the output terminal 119 takes a voltage waveform having a long falling time (slow falling-down) but a minimized falling propagation delay time.

In the above mentioned embodiment, the P-channel transistor 117 and the N-channel transistor are used to constitute the output driving stage, but it would be apparent to persons skilled in the an that the present invention can be equally applied to an output buffer including an output driving stage composed of only a single P-channel or N-channel transistor, or an output buffer composed of field effect transistors other than MOS transistors. In addition, in order to shorten the propagation delay time in the output buffer circuit of the shown embodiment, or in order to reduce a circuit area of the output buffer circuit of the shown embodiment, the circuit can be modified by adding or deleting an inverter connected to the input terminal.

As seen from the above, the output buffer circuit so configured that a capacitor means connected to a gate of an output driving MOS transistor and including a gate capacitance of the output driving MOS transistor is gradually charged through a resistor means, so as to have a slow rising or falling time, is additionally provided, in accordance with the present invention, with a threshold voltage charging means for rapidly charging the capacitor means to a threshold voltage level of the output driving MOS transistor when the output driving MOS transistor is to be turned on. With this feature, the propagation delay time of the output voltage on the output terminal can be minimized.

In addition, when the rising or the falling is made at a slow speed in a system required to have a low noise, since the propagation delay time is minimized, the variation of phase in output signals which would be caused for variations in the manufacturing condition and in the operating condition, can be reduced. As a result, it is possible to elevate the operating frequency of the overall system.

The invention has thus been shown and described with reference to the specific embodiments. However, it should be noted that the present invention is in no way limited to the details of the illustrated structures but changes and modifications may be made within the scope of the appended claims.

I claim:

1. An output buffer circuit comprising:
   an input terminal;
   an output terminal;
   an output driving P-channel transistor having a drain electrode connected to said output terminal and a source electrode connected to a voltage supply line;
   a capacitor having one end connected to a gate electrode of said output driving P-channel transistor, the other end of said capacitor being connected to said voltage supply line;
   an inverter having an input connected to said input terminal and an output connected through a resistor to said one end of said capacitor;

a discharging P-channel transistor having a gate connected to said input terminal and connected in parallel to said capacitor, so that when a potential on said input terminal is brought to a low level for the purpose of turning off said output driving P-channel transistor, said discharging P-channel transistor is turned on so as to discharge said capacitor; and a threshold voltage charging circuit connected to said one end of said capacitor and controlled by said potential on said input terminal for rapidly charging said capacitor to a threshold voltage level of said output driving P-channel transistor when the potential on said input terminal is brought to a high level for the purpose of turning on said output driving P-channel transistor.

2. An output buffer circuit claimed in claim 1 wherein said threshold voltage charging circuit includes:

a precharge capacitor having one end connected to a ground line;

a precharging N-channel transistor connected in parallel to said precharge capacitor and having a gate connected through an inverter to said input terminal so that when the potential on said input terminal is at said low level, said precharging N-channel transistor is on so as to precharge said precharge capacitor to a ground level of said ground line; and a coupling N-channel transistor connected between said one end of said capacitor and the other end of said precharge capacitor and having a gate connected to said input terminal so that when the potential on said input terminal is brought to said high level, said coupling N-channel transistor is turned on so as to connect said one end of said capacitor to the other end of said precharge capacitor so that a potential on said one end of said capacitor is quickly brought to an intermediate level between a voltage supply level of said voltage supply line and said ground level of said ground line, said intermediate level being substantially equal to said threshold voltage level of said output driving P-channel transistor.

3. An output buffer circuit comprising:

an input terminal;

an output terminal;

an output driving N-channel transistor having a drain electrode connected to said output terminal and a source electrode connected to a ground line;

a capacitor having one end connected to a gate electrode of said output driving N-channel transistor, the other end of said capacitor being connected to said ground line;

an inverter having an input connected to said input terminal and an output connected through a resistor to said one end of said capacitor;

a discharging N-channel transistor having a gate connected to said input terminal and connected in parallel to said capacitor, so that when a potential on said input terminal is brought to a high level for the purpose of turning off said output driving N-channel transistor, said discharging N-channel transistor is turned on so as to discharge said capacitor; and a threshold voltage charging circuit connected to said one end of said capacitor and controlled by said potential on said input terminal for rapidly charging said capacitor to a threshold voltage level of said output driving N-channel transistor when the potential on said input terminal is brought to a low level for the purpose of turning on said output driving N-channel transistor.

4. An output buffer circuit claimed in claim 3 wherein said threshold voltage charging circuit includes:

a precharge capacitor having one end connected to a voltage supply line;

a precharging P-channel transistor connected in parallel to said precharge capacitor and having a gate connected through an inverter to said input terminal so that when the potential on said input terminal is at said high level, said precharging P-channel transistor is on so as to precharge said precharge capacitor to a voltage supply level of said voltage supply line; and a coupling P-channel transistor connected between said one end of said capacitor and the other end of said precharge capacitor and having a gate connected to said input terminal so that when the potential on said input terminal is brought to said low level, said coupling P-channel transistor is turned on so as to connect said one end of said capacitor to the other end of said precharge capacitor so that a potential on said one end of said capacitor is quickly brought to an intermediate level between a voltage supply level of said voltage supply line and said ground level of said ground line, said intermediate level being substantially equal to said threshold voltage level of said output driving N-channel transistor.

* * * * *